US005642071A

United States Patent [19]

Sevenhans et al.

[11] Patent Number: 5,642,071

[45] Date of Patent: Jun. 24, 1997

[54] TRANSIT MIXER WITH CURRENT MODE INPUT

[75] Inventors: Joannes Mathilda Josephus Sevenhans, Brasschaat; Jean-Luc Donat Maurice R. Bacq, Vilvoorde; Damien Luc Francois Macq, Ottignies-Louvain-La-Neuve, all of Belgium

[73] Assignee: Alcatel N.V., Netherlands

[21] Appl. No.: 554,448

[22] Filed: Nov. 7, 1995

[30] Foreign Application Priority Data

Nov. 7, 1994 [EP] European Pat. Off. .............. 94203236

[51] Int. Cl.$^6$ .................................................... H03B 19/00

[52] U.S. Cl. .......................... 327/359; 327/357; 327/105; 327/119; 327/103

[58] Field of Search .................................... 327/355, 356, 327/357, 359, 116, 114, 113, 119, 105, 103; 455/333, 326

[56] References Cited

U.S. PATENT DOCUMENTS

| | | | |
|---|---|---|---|
| 4,458,210 | 7/1984 | Hori | 327/359 |
| 4,675,594 | 6/1987 | Reinke | 327/103 |
| 4,801,827 | 1/1989 | Metz | 327/356 |
| 4,936,516 | 6/1990 | Sempel | 323/315 |
| 5,115,409 | 5/1992 | Stepp | 327/357 |
| 5,151,625 | 9/1992 | Zarabadi et al. | 307/529 |
| 5,196,742 | 3/1993 | McDonald | 327/114 |
| 5,329,189 | 7/1994 | Ushida et al. | 327/105 |
| 5,396,659 | 3/1995 | Kimura | 455/333 |
| 5,414,383 | 5/1995 | Cusdin et al. | 327/357 |
| 5,532,637 | 7/1996 | Khoury et al. | 327/359 |
| 5,548,840 | 8/1996 | Heck | 327/358 |

FOREIGN PATENT DOCUMENTS

| | | |
|---|---|---|
| 0316999 | 5/1989 | European Pat. Off. . |
| 4205486 | 12/1992 | Germany . |
| 2261130 | 5/1993 | United Kingdom . |

OTHER PUBLICATIONS

"Low Voltage Techniques for High Frequency Si-Bipolar Circuits", MWE '93 Microwave Workshop Digest, pp. 357–360 1993.

P. Gray et al, "Analysis and Design of Analog Integrated Circuits", John Wiley & Sons (New York) 1977, pp. 563–575 no month.

*Primary Examiner*—Timothy P. Callahan
*Assistant Examiner*—Eunja Shin
*Attorney, Agent, or Firm*—Ware, Fressola, Van Der Sluys & Adolphson LLP

[57] ABSTRACT

A differential mixer (DM) used in a telecommunication radio transmitter able to operate with a 3 Volt supply includes a silicon bipolar cross-connected pair of differential amplifiers (A; B) for receiving a first input voltage (LO) at a high frequency, a pair of current sources (I1; I2), and a voltage-to-current MOS converter (VIC) for receiving a second input voltage (VIN) at a lower frequency. The converter is adapted to convert the low frequency voltage to a differential current (INN) and is coupled to the junction points of the amplifiers and the current sources. The converter further includes a regulated differential cascode circuit (P1; P2) to which the low frequency input voltage (VIN) is applied via resistors (RI1; RI2) and which is coupled to the supply terminals (VCC; GND) of the mixer via two pairs of constant current sources (PB1, PB2; NB1, NB2) respectively. Preferably, a constant reference voltage terminal (VCC/2) is applied to the gate electrode of the transistors (P1; P2) of the cascode circuit via an operational amplifier (O1; O2).

9 Claims, 2 Drawing Sheets

VCC
R1
R2
OUT
LO
A
B
R3
R4
C1
C2
J1
J2
VBA
T1
T2
I1
I2
R5
R6
TI1
GND
TI2
VIC
INN
VIN
DM

VIC

TRANSIT MIXER WITH CURRENT MODE INPUT

TECHNICAL FIELD

The present invention relates to a differential mixer adapted to multiply a first differential input voltage supplied at a first voltage input with a second differential input voltage supplied at a second voltage input and including a cross-connected pair of differential amplifiers having said first voltage input and coupled to a differential mixing input to which are coupled a voltage-to-current converter means and a current source, said voltage-to-current converter means having said second voltage input and being adapted to convert said second input voltage to a differential current supplied to said differential mixing input.

BACKGROUND OF THE INVENTION

Such a differential mixer is already known in the art, e.g. under the form of a Gilbert cell as described in the book "*Analysis and design of analog integrated circuits*" of P. R. Gray and R. G. Meyer, published by J. Wiley & Sons, New York, 1977, and more particularly on pages 563 to 575 thereof. This known mixer comprises, between its voltage supply terminals, three circuit levels:

a first input level including the pair of cross-linked differential amplifiers to which the first input voltage is applied;

a second input level including a differential amplifier to which the second input voltage is applied and which provides the differential current; and a bias level including the current source.

Over the past few years, a Gilbert cell generally built up with bipolar switching transistors suited perfectly to be used as mixer or multiplier in GSM (Global System for Mobile communications) or other radio transmitters operating with a 5 Volt supply. Today however, silicon bipolar designers are struggling for the next step: a 3 Volt supply in battery operated wireless phones. The 3 Volt supply, with a tolerance of±10%, allows to reduce the number of batteries, the cost, the volume and the weight of the handset.

Since a silicon bipolar switching transistors has an emitter-to-collector voltage drop of at least 1 Volt, the overall voltage drop across the above three circuit levels of a Gilbert cell is at least equal to 3 Volt. The known Gilbert cell can thus no longer be used with a 3 Volt supply because this leaves no headroom for the signal, especially when the supply voltage drops towards 2.7 Volt at the end of the battery cycle.

DISCLOSURE OF INVENTION

An object of the present invention is to provide a differential mixer of the above known type but which is adapted to operate with a lower voltage supply, e.g. of 3 Volt.

According to the invention, this object is achieved due to the fact that said current source includes two identical parallel current branches connected to distinct ones of said differential amplifiers via distinct terminals of said differential mixing input and that said voltage-to-current converter means has a differential current output at which said differential current is supplied and which is connected to said differential mixing inputs.

Since the voltage-to-current converter means only provides a differential current, the latter has no influence on the voltage at the differential mixing input. The present differential mixer may thus be seen as having only two circuit levels between its supply terminals:

a first input level including the pair of cross-linked differential amplifiers mentioned above and to which the first input voltage, e.g. the output of a local oscillator, is applied; and a bias level including the current sources with its two parallel branches.

The voltage supply across the present mixer may thus be reduced, e.g. to 3 Volt, with respect to that of the above known three circuit levels Gilbert cell requiring 5 Volt. This still leaves sufficient headroom for the useful signal.

Another characteristic feature of the present invention is that said voltage-to-current converter means includes a differential cascode circuit including transistors having an input terminal to which said second differential voltage input is connected via a resistor, an output terminal connected to said differential current output, and a control terminal to which a constant reference voltage terminal is coupled, and that said voltage-to-current converter means further includes a first pair of constant current sources coupling a first supply terminal to the input terminals of said transistors and a second pair of constant current sources coupling the output terminals of said transistors to a second supply terminal.

It is well known in the art that a cascode circuit as a low input impedance and a high output impedance and that the current at the input terminal of the transistor is thereby directly and linearly proportional to the input voltage, the latter linearity being obviously related to the linearity of the resistor. In more detail, the value of the current is here equal to the value of the second input voltage divided by the value of the resistor. In other words, this current is a replica of the second input voltage.

Moreover, owing to the four current sources, the voltages at the input and output terminals of the transistors remain constant. This improves the above linearity of the cascode circuit.

In a preferred embodiment of the present differential mixer said constant reference voltage terminal is coupled to the control terminal of each of said transistor via a distinct operational amplifier of which another input is connected the input terminal of said transistor.

The above cascode circuit thereby becomes a so-called regulated cascode circuit wherein the voltage at the input terminal is accurately fixed by the operational amplifier at a value which is equal to that of the constant reference voltage at the reference voltage terminal. The linearity of the cascode circuit is then even more improved.

In the above mentioned particular application of a radio transmitter, the present differential mixer is further also characterized in that said first differential input voltage has a relatively high frequency, in that said second differential input voltage has a relatively low frequency, and in that said cross-connected pair of differential amplifiers is coupled to said differential mixing inputs via low pass filters.

High frequency components of the signals in the cross-connected differential pairs are thereby prevented from influencing the operation of the voltage-to-current converter means.

The present invention is further also characterized in that said transistors of said voltage-to-current converter means are MOS transistors, in that said input output and control terminals are the source, drain and gate electrodes of said transistors respectively, and in that said cross-connected pair of differential amplifiers includes silicon bipolar transistors.

Silicon bipolar transistors operate very well at high frequencies, e.g. at the radio carrier frequency, but they are relatively expensive, whereas MOS transistors are cheaper but can unfortunately not yet accurately operate at such high frequencies. This is especially true when these components are integrated in an electronic chip, as it is the case of the present invention. In the present differential mixer however, the voltage-to-current converter means is integrated in a relatively inexpensive and big MOS chip, whereas the cross-connected pair of differential amplifiers is integrated in a more expensive but smaller bipolar chip.

These and other objects, features and advantages of the present invention will become more apparent in light of the detailed description of a best mode embodiment thereof, as illustrated in the accompanying drawing.

BEST MODE FOR CARRYING OUT THE INVENTION

Figure 1:
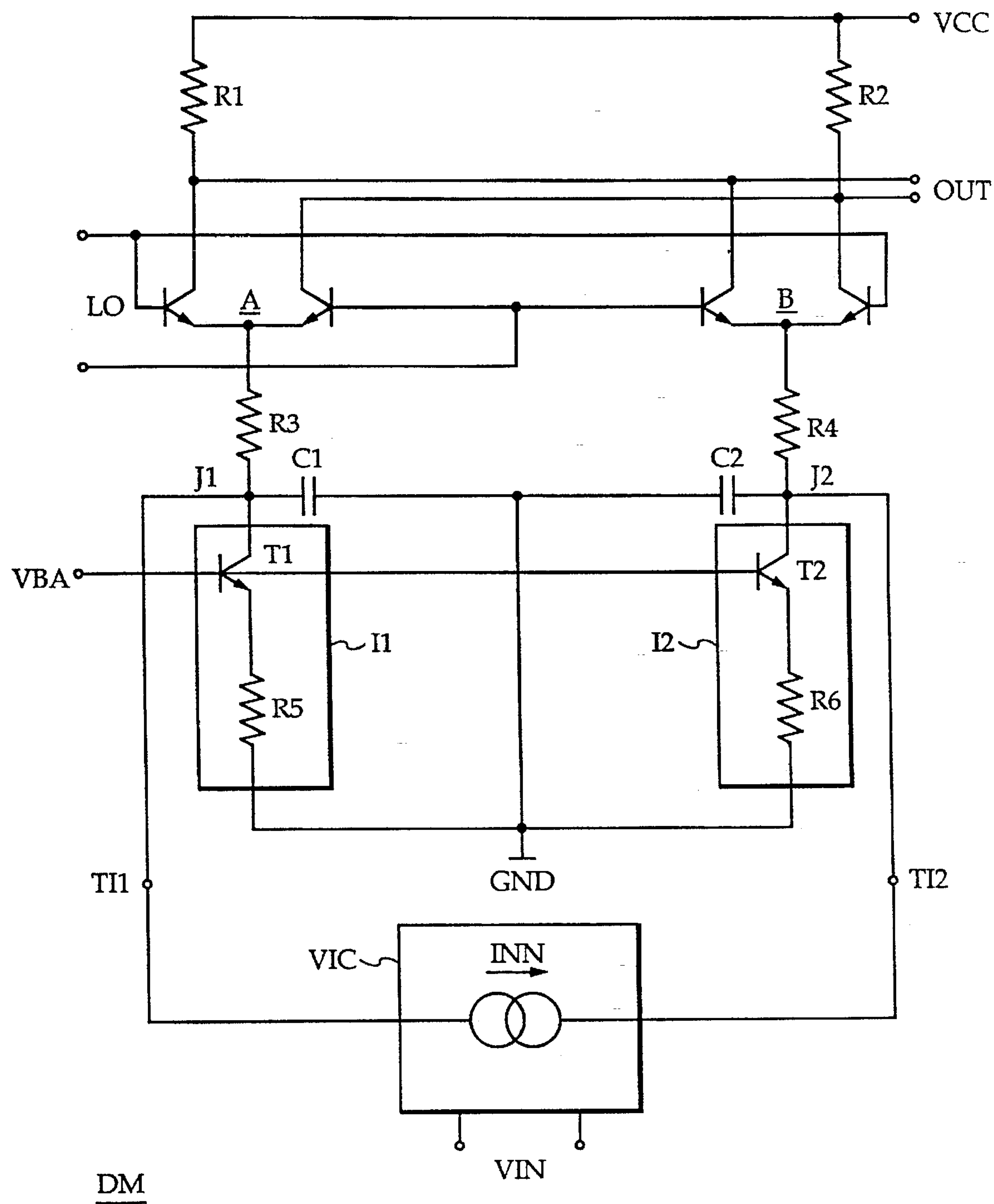
FIG. 1 shows a differential mixer DM according to the invention.

The differential mixer DM represented in FIG. 1, according to the invention, is used in a transmitter of the well known GSM (Global System for Mobile communications) radio communication system. The purpose of DM is to mix or multiply the output signal of a local oscillator (not shown) operating at 900 MHz with a baseband signal VIN having a much lower frequency, e.g. of about 100 kHz, the latter signal being the single side phase modulation signal of the GSM transmitter. The output signal of the local oscillator is applied to differential voltage input terminals LO of DM, the baseband signal VIN is applied to like named differential voltage input terminals VIN and the resulting mixed signal is provided at a differential voltage output OUT of DM.

The differential mixer DM operates with a supply voltage of 3 Volt applied between a supply terminal VCC, on which a like named supply voltage VCC of +3 Volt is available, and a common or ground node GND, and has a well known structure including a pair of cross-connected differential amplifiers A and B. Each of these differential amplifiers includes two silicon bipolar NPN switching transistors to the base electrodes of which the input terminals LO are connected. The collector electrode of a first switching transistor of each pair is connected to a first terminal of the output OUT directly and to the supply terminal VCC via a first load resistor R1, while the collector of the second switching transistor of the pair is connected to the second terminal of the output OUT directly and to VCC via a second load resistor R2, the latter being identical to resistor R1. The emitter electrodes of the switching transistors of each differential amplifier pair A, B are connected in common to a distinct current source I1, I2 via a resistor R3, R4 respectively.

The junction points J1 and J2 of resistor R3 with source I1 and resistor R4 with source I2 constitute the terminals of a differential mixing input and are coupled to respective terminals TI1 and TI2 which are external to the electronic chips wherein the differential mixer DM is integrated. The terminals J1 and J2 are further coupled to ground GND via respective capacitors C1 and C2.

It is to be noted that capacitors C1 and C2 are partially or completely constituted by the parasitic collector-to-bulk capacitors of the transistors of current sources I1 and I2 which will be described below, the values of these capacitors being determined as a function of the frequency of the local oscillator.

A voltage-to-current converter VIC adapted to convert the baseband signal VIN into a floating balanced differential baseband current INN is connected to the terminals TI1 and TI2 and will be described later by making reference to FIG. 2.

The current source I1 comprises between junction point J1 and ground terminal the series connection of the collector-to-emitter path of a NPN transistor T1 and a resistor R5 and the current source I2 comprises between point J2 and ground GND the series connection of the collector-to-emitter path of a NPN transistor T2 and a resistor R6, transistor T2 being identical to transistor T1 and resistor R6 being identical to R5. A "bandgap" reference DC voltage is simultaneously applied to the base electrodes of both the transistors T1 and T2 via a control terminal VBA. This bandgap voltage is a temperature controlled voltage which, between −25 and +75 degrees Celsius, compensates any fluctuation of the base-to-emitter voltage of the NPN switching transistors of the differential amplifiers A and B as a function of the temperature. The bandgap voltage is provided by a circuit well known in the art and therefore not shown here. As a result, the current flowing in the identical current sources I1 and I2 remains constant and no common mode current flows in the mixer DM. The current sources I1 and I2 may further be seen as two parallel branches of a same single current source.

The resistor and capacitor components R3 and C1, respectively, as well as R4 and C2 constitute integrators or low pass filters preventing the transmission of high frequency signals used in the upper part of the mixer DM (900 MHz at the emitter electrodes of the switching transistors of the differential pairs A and B) to the lower part thereof, i.e. to the voltage-to-current converter VIC described below. The R3-C1 and R4-C2 filters are also known as "reverse leak" protection arrangements.

Figure 2:
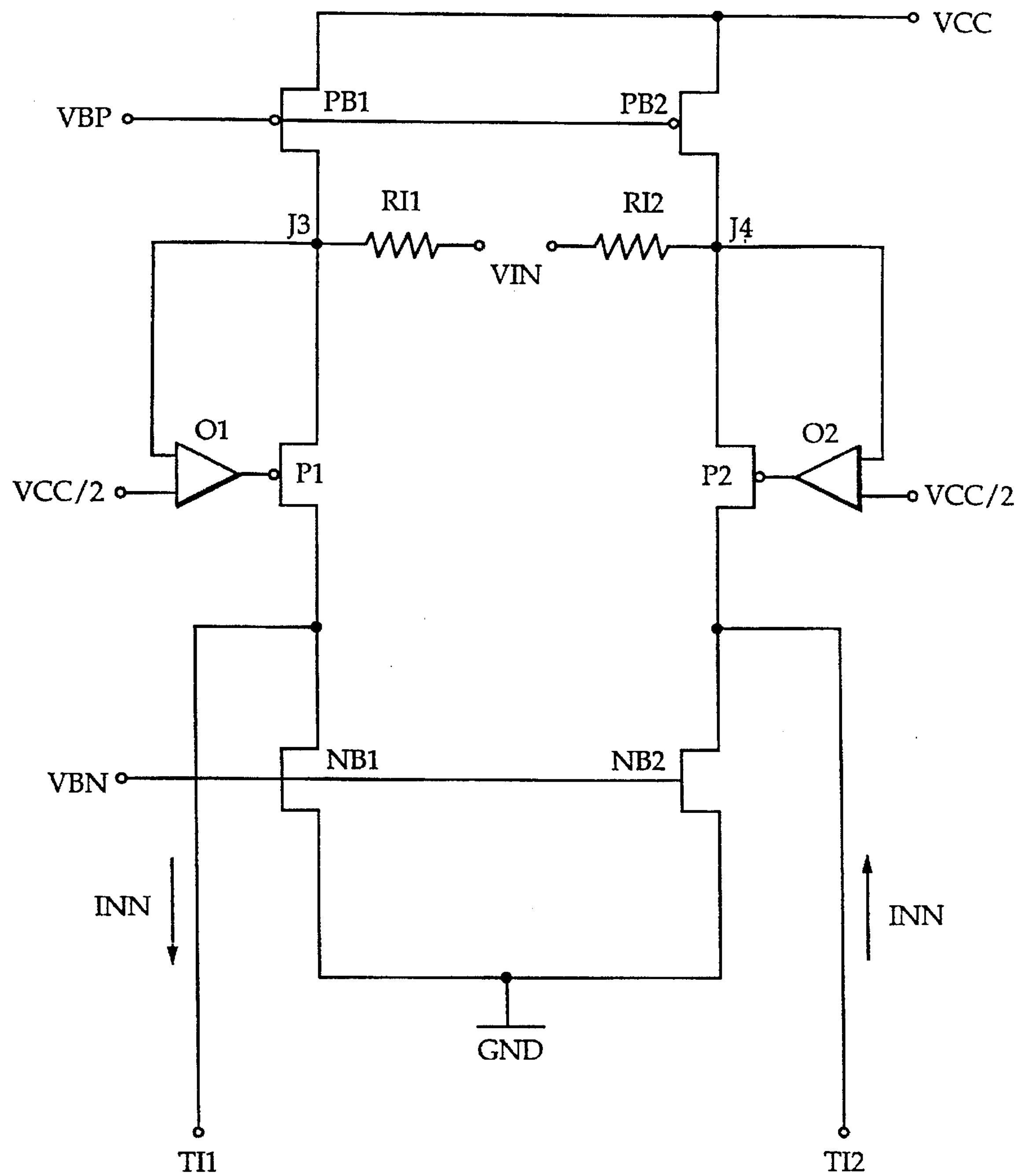
FIG. 2 represents a voltage-to-current converter VIC included in the differential mixer of FIG. 1.

The voltage-to-current converter VIC shown in FIG. 2 also operates with the 3 Volt supply provided between the terminals VCC and GND and has the differential baseband voltage input terminals VIN and the differential output terminals TI1 and TI2. Between VCC and GND, VIC includes two parallel branches each comprising the series connection of the main paths of a PMOS transistor PB1, PB2, a PMOS transistor P1, P2, and a NMOS transistor NB1, NB2 respectively.

A first bias voltage is applied to a first bias control terminal VBP connected to the gate electrodes of both the transistors PB1 and PB2, while a second bias voltage is applied to a second bias control terminal VBN connected to the gate electrodes of both the transistors NB1 and NB2. These bias voltages are such that a same constant current flows through the main paths of the transistors PB1, NB1 and PB2, NB2 which thus all four behave as constant DC current sources.

The terminals of the differential input VIN are coupled to the junction points J3 and J4 of the drain electrode of transistors PB1, PB2 and the source electrode of transistors P1, P2 respectively via a distinct resistor RI1 and RI2, and the junction points of the drain electrode of transistors P1, P2 and the drain electrode of transistors NB1, NB2 are respectively connected to the terminals TI1, TI2. The resistors RI1 and RI2 may either be polysilicon resistors on the chip or external resistors.

VIC further includes two operational amplifiers O1 and O2 to a first input of which a reference voltage equal to one half of the supply voltage, i.e. +1.5 Volt, is applied via a control terminal VCC/2. The junction points J3 and J4 are connected to a second input of O1 and O2, while the output of the latter is connected to the gate electrode of P1 and P2 respectively. In a variant (not shown) of the voltage-to-current converter, the latter operational amplifiers are each constituted by a single transistor.

The junction points J3 and J4, to which the constant current sources PB1 and PB2 are connected, are thus at a constant reference voltage, equal to VCC/2, as fixed by the operational amplifiers O1 and O2 respectively. As a result, the sources of P1, P2 are virtually grounded and the circuits designated P1, O1 and P2, O2 behave as so-called "regulated cascode" circuits which have a low input impedance (virtual ground) at junctions J3, J4 and a high output impedance at NPN transistors TI1, TI2. Indeed, additionally to the fact that a MOS transistor inherently has a high output impedance on its drain electrode and a low input impedance on its source electrode, the output impedance PMOS transistors of P1 and P2 has an increased value owing to the cascode arrangement of which it forms part, while the input impedance has a decreased value due to operational amplifiers O1 and O2. The reason therefor is that operational amplifiers O1, O2 a feedback loop which fixes the voltage at the source of constitute PMOS transistors P1, P2, i.e. at junction points J1, J2, to the reference voltage at VCC/2. This voltage thus remains constant independently of the current flowing through junction points J1, J2. In more detail, the input impedance of PMOS transistors P1, P2 is inversely proportional to product of the transconductance ($g_m$) of this MOS transistor and the loop gain of the operational amplifier O1 and O2 respectively, and both these transconductance and gain being relatively high.

Owing to the very low input impedance, any current flowing through resistors RI1, RI2 is integrally transmitted to PMOS transistors P1, P2 and no part thereof is derived by the current source PB1, PB2, while a possible non-linear impedance shown by the transistor P1, P2 has no influence on the voltage-to-current conversion performed by resistors RI1, RI2. The differential input voltage VIN is thus linearly and accurately converted to a differential current at the junction points J3 and J4 by the resistors RI1 and RI2. Moreover, because the DC currents flowing through transistors PB1, NB1 and transistors PB2, NB2 and thus also transistors P1, P2 are identical and constant, the current flowing through resistors RI1, RI2 may be seen as a floating balanced differential baseband current INN which is also available at the current terminals TI1 and TI2.

As already mentioned, the purpose of the present differential mixer DM is to modulate (mix) a high frequency radio signal provided at LO with a baseband signal provided at VIN and its operation is explained hereafter.

The floating balanced differential baseband current INN is thus derived from the low frequency input voltage VIN by the voltage-to-current converter VIC and is injected in the high frequency part of differential mixer DM, i.e. in the differential amplifiers A and B, via the terminals TI1 and TI2. Because of its high output impedance at terminals TI1/TI2, voltage-to-current converter VIC behaves as a current source. As a consequence, the voltage at the terminals TI1 and TI2 is not influenced by converter VIC but is only determined by the cross-connected differential pairs A and B and more particularly by the emitter voltage of the switching transistors thereof. The common mode voltage at terminals TI1/TI2, i.e. at junction points J1/J2, is thus only function of the common mode input voltage at the local oscillator input terminals LO. The differential voltage across terminals TI1 and TI2 is determined by the input impedance of the emitter electrodes of the bipolar transistors of the above differential amplifiers A and B and the modulation current INN. This current INN, derived from the low frequency input voltage VIN, is then mixed with the high frequency input voltage at local oscillative terminals LO and the resulting differential output voltage is provided at the output OUT.

Silicon bipolar transistors are used in the upper part (FIG. 1) of the differential mixer DM which, as already mentioned, operates at a high frequency, and MOS transistors are used in the lower part (FIG. 2) of DM. The reason is that MOS transistors are relatively cheaper than bipolar transistors but can unfortunately not yet accurately operate at high frequencies where bipolar transistors are still preferred.

If the terminals TI1 and TI2 are external to the electronic chip they may be used as interfaces between the bipolar and MOS technology whereby the upper and lower part of DM may be integrated in two distinct electronic chips.

The current sources I1 and I2 are build in the bipolar part of the mixer DM to control the overall current in this mixer and to avoid thereby the use of additional current sources in the CMOS part of this mixer.

While the principles of the invention have been described above in connection with specific apparatus, it is to be clearly understood that this description is made only by way of example and not as a limitation on the scope of the invention which is defined by the claims. Similarly, although the invention has been shown and described with respect to a best mode embodiment thereof, it should be understood by those skilled in the art that the foregoing and various other changes, omissions and additions in the form and detail thereof may be made therein without departing from the spirit and scope of the invention.

We claim:

1. Differential mixer (DM) coupled between a first (VCC) and a second (GND) voltage supply terminal for multiplying a first differential input voltage supplied at a first differential voltage input (LO) with a second differential input voltage supplied at a second differential voltage input (VIN), said differential mixer (DM) including a cross-connected pair of differential amplifiers (A; B) responsive to said first differential voltage input and coupled between said first (VCC) voltage supply terminal and a differential pair of mixing input terminals (J1; J2) to which are also coupled a voltage-to-current converter means (VIC) and a current source (I1; I2), said current source including two identical parallel current branches, each connected between distinct differential amplifiers (A; B) via a distinct mixing input terminal (J1; J2) and said second (GND) voltage supply terminal, said parallel current branches each comprising a series connection of a transistor (T1; T2) and a resistor (R5; R7) and said voltage-to-current converter means responsive to said second differential voltage input for converting said second differential input voltage to a differential current (INN) supplied to said differential mixing input terminals, said voltage-to-current converter means including a differential cascode circuit of transistors (P1; P2) having input terminals (J3; J4) to which said second differential voltage input are connected via resistors (RI1; RI2), output terminals connected to said mixing input terminals which are current output terminals (TI1; TI2), and control terminals to which a constant reference voltage terminal (VCC/2) is coupled, said voltage-to-current converter means further including a first pair of constant current sources (PB1, PB2) coupling said first (VCC) voltage supply terminal to the input terminals of said transistors, and a second pair of constant current sources (NB1, NB2) coupling the output terminals of said transistors to said second (GND) voltage supply terminal.

2. Differential mixer according to claim 1, characterized in that said constant reference voltage terminal (VCC/2) is coupled to the control terminal of each of said transistors (P1; P2) via a distinct operational amplifier (O1; O2) of which another input is connected to the input terminal (J3; J4) of said transistor.

3. Differential mixer according to claim 1, characterized in that said first differential input voltage has a relatively high frequency, in that said second differential input voltage has a relatively low frequency, and in that said cross-connected pair of differential amplifiers (A; B) is coupled to said differential pair of mixing input terminals. (J1; J2) via low pass filters (R3, C1; R4, C2).

4. Differential mixer according to claim 1, characterized in that said transistors (P1; P2) of said voltage-to-current converter means (VIC) are MOS transistors and in that said input (J3; J4), output and control terminals are the source, drain and gate electrodes of said transistors respectively.

5. Differential mixer according to claim 1, characterized in that said cross-connected pair of differential amplifiers (A; B) includes silicon bipolar transistors.

6. Differential mixer according to claim 1, characterized in that said differential mixer (DM) includes, coupled between said first (VCC) and said second (GND) voltage supply terminal, a series connection of load resistors (R1; R2), said cross-connected pair of differential amplifiers (A; B), said differential mixing input (J1; J2) and said current source.

7. Differential mixer according to claim 6, characterized in that low pass filters (R3, C1; R4, C2) are located between said cross-connected pair of differential amplifiers (A; B) and said differential mixing input (J1; J2).

8. Differential mixer according to the claim 4, characterized in that said cross-connected pair of differential amplifiers (A; B) and said current source (I1; I2) are integrated in a first electronic chip, and said voltage-to-current converter means (VIC) is integrated in a second electronic chip, said first and second electronic chips being interconnected via said differential pair of mixing input terminals (J1; J2).

9. Differential mixer according to the claim 5, characterized in that said cross-connected pair of differential amplifiers (A; B) and said current source (I1; I2) are integrated in a first electronic chip, and said voltage-to-current converter means (VIC) is integrated in a second electronic chip, said first and second electronic chips being interconnected via said differential pair of mixing input terminals (J1; J2).

* * * * *

UNITED STATES PATENT AND TRADEMARK OFFICE
CERTIFICATE OF CORRECTION

PATENT NO. : 5,642,071

DATED : June 24, 1997

INVENTOR(S) : Sevenhans et al

It is certified that error appears in the above-identified patent and that said Letters Patent is hereby corrected as shown below:

At INID [54], and in col. 1, line 2, please cancel "TRANSIT" and substitute --TRANSMIT-- therefor.

At column 7, line 16, please cancel "." after "terminals".

Signed and Sealed this

Twenty-eighth Day of October, 1997

*Attest:*

BRUCE LEHMAN

*Attesting Officer*

*Commissioner of Patents and Trademarks*